US012710065B2

(12) United States Patent
Qin

(10) Patent No.: US 12,710,065 B2
(45) Date of Patent: Aug. 18, 2026

(54) ANTI-DISASSEMBLY DEVICE

(71) Applicant: Shenzhen Fulian Fugui Precision Industry Co., Ltd., Shenzhen (CN)

(72) Inventor: Dong Qin, Shenzhen (CN)

(73) Assignee: Shenzhen Fulian Fugui Precision Industry Co., Ltd., Shenzhen (CN)

( * ) Notice: Subject to any disclaimer, the term of this patent is extended or adjusted under 35 U.S.C. 154(b) by 349 days.

(21) Appl. No.: 18/591,185

(22) Filed: Feb. 29, 2024

(65) Prior Publication Data

US 2025/0243884 A1 Jul. 31, 2025

(30) Foreign Application Priority Data

Jan. 31, 2024 (CN) ......................... 202410137552.0

(51) Int. Cl.
*F16B 5/06* (2006.01)
*H05K 5/02* (2006.01)

(52) U.S. Cl.
CPC .......... *F16B 5/0642* (2013.01); *F16B 5/0664* (2013.01); *H05K 5/0208* (2013.01); *Y10T 403/602* (2015.01); *Y10T 403/7005* (2015.01); *Y10T 403/75* (2015.01)

(58) Field of Classification Search
CPC ........ F16B 1/04; F16B 5/0088; F16B 5/0092; F16B 5/0621; F16B 5/0642; F16B 5/0657; F16B 5/0664; F16B 5/10; F16B 21/02; F16B 21/04; F16B 41/005; F16B 2005/0671; H01L 23/4093; H05K 5/0208; H05K 5/0217; H05K 5/0221; Y10T 403/59; Y10T 403/599; Y10T 403/60; Y10T 403/602; Y10T 403/7005; Y10T 403/7007; Y10T 403/7015; Y10T 403/75
USPC ....... 403/321, 325, 326, 327, 348, 349, 353, 403/408.1; 411/552, 910
See application file for complete search history.

(56) References Cited

U.S. PATENT DOCUMENTS 3,535,752 A * 10/1970 Dzus .......................... F16B 5/10 411/555
3,564,563 A * 2/1971 Trotter et al. ............. F16B 5/10 411/926
3,827,110 A * 8/1974 Dzus, Sr. .................. F16B 5/10 411/348

(Continued)

FOREIGN PATENT DOCUMENTS

CN 201916291 U 8/2011
CN 206022441 U 3/2017

(Continued)

*Primary Examiner* — Josh Skroupa
(74) *Attorney, Agent, or Firm* — ScienBiziP, P.C.

(57) ABSTRACT

An anti-disassembly device includes a first part including a first through hole; a fixing element affixed to the first part; a bolt movably disposed on the fixing element; an elastic element between the fixing element and the bolt; a second part in contact with the first part and having a second through hole; and a nail movably disposed in the first through hole and the second through hole. The nail has a lock groove. In a locked state, the nail is engaged with the first part and the second part, and the bolt is located in the lock groove and prevents the nail from rotating relative to the first part. When the nail is rotated to an unlocking position, the nail allows the first part to separate from the second part.

14 Claims, 9 Drawing Sheets

(56) References Cited

U.S. PATENT DOCUMENTS

| | | | | | |
|---|---|---|---|---|---|
| 4,040,151 | A * | 8/1977 | Brimm | F16B 21/04 | 411/105 |
| 4,711,760 | A * | 12/1987 | Blaushild | F16B 39/10 | 411/910 |
| 4,878,792 | A * | 11/1989 | Frano | F16B 21/065 | 24/615 |
| 5,361,925 | A | 11/1994 | Wecke et al. | | |
| 5,449,260 | A * | 9/1995 | Whittle | F16B 41/005 | 411/377 |
| 5,779,422 | A * | 7/1998 | Petignat | F16B 21/04 | 411/553 |
| 7,110,261 | B2 * | 9/2006 | Lee | H10W 40/641 | 165/185 |
| 7,283,368 | B2 * | 10/2007 | Wung | H10W 40/641 | 165/185 |
| 7,990,715 | B2 * | 8/2011 | Chen | H10W 40/641 | 174/16.3 |
| 8,491,246 | B2 * | 7/2013 | Chao | F16B 21/02 | 411/347 |
| 10,539,172 | B2 * | 1/2020 | Bowers | F16B 21/04 | |
| 11,064,796 | B1 * | 7/2021 | Blauer | F16B 5/0664 | |
| 2005/0220568 | A1 * | 10/2005 | Fink | F16B 21/02 | 411/553 |
| 2009/0074539 | A1 * | 3/2009 | Mahdavi | F16B 21/02 | 411/533 |
| 2014/0306593 | A1 * | 10/2014 | Gong | H05K 5/0221 | 312/326 |
| 2019/0040901 | A1 * | 2/2019 | Bowers | F16B 5/10 | |
| 2023/0110234 | A1 * | 4/2023 | Wu | F16B 21/02 | 403/322.2 |
| 2025/0305531 | A1 * | 10/2025 | Hymas | F16B 21/02 | |

FOREIGN PATENT DOCUMENTS

| | | | | |
|---|---|---|---|---|
| CN | 112178013 A | | 1/2021 | |
| GB | 822016 A | * | 10/1959 | F16B 5/10 |
| TW | 201503797 A | | 1/2015 | |

* cited by examiner

ANTI-DISASSEMBLY DEVICE

FIELD

The subject matter herein generally relates to anti-disassembly devices to be disassembled by tools.

BACKGROUND

In generally, when electronic products are sold to consumers, the manufacturers provide warranty service for a period of time, and offer free or partially subsidized repair service for damages of electronic products under normal use. However, the damage of electronic products may be caused by improper operation when users disassemble electronic products by themselves.

In order to clarify the cause of the damages to electronic products are caused by normal use or by users attempting to disassemble the electronic products. Manufacturers may install anti-disassembly devices on the casings of electronic products to prevent unauthorized disassembling of the electronic products or to show traces of disassembly of the electronic products. Such anti-disassembly devices may provide basis for determining the responsibility for damages to electronic products when the manufacturers perform maintenance services in the future.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
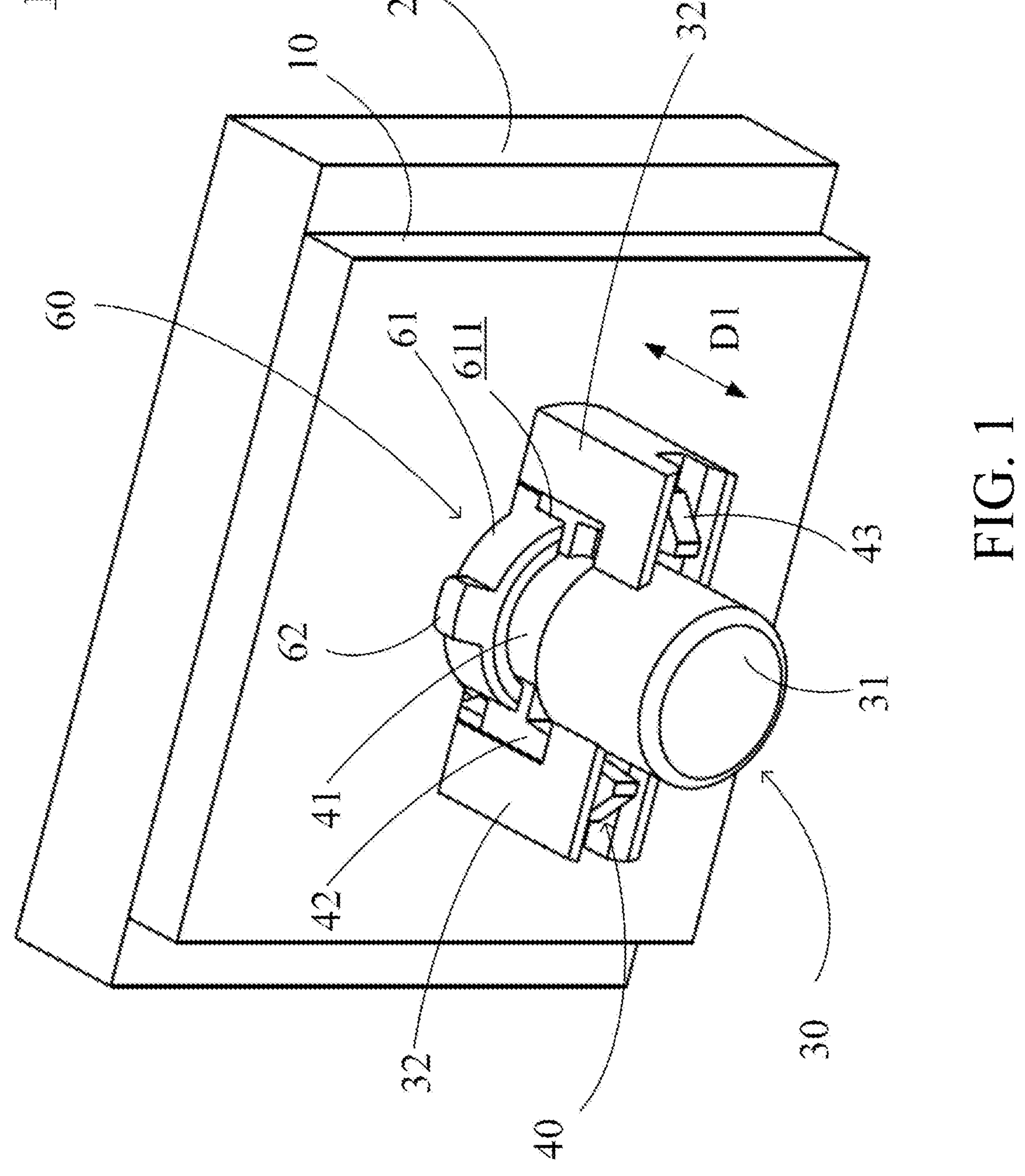
FIG. 1 is a perspective view of a first embodiment of an anti-disassembly device in accordance with of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connect" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The present disclosure provides an anti-disassembly device that prevents users from easily disassembling the casing of electronic products. In addition, after users remove the casing of electronic products, it will cause damage to the anti-disassembly device that is difficult to recover. The manufacturers can determine whether the user is responsible for the damage to the electronic device.

Figure 2:
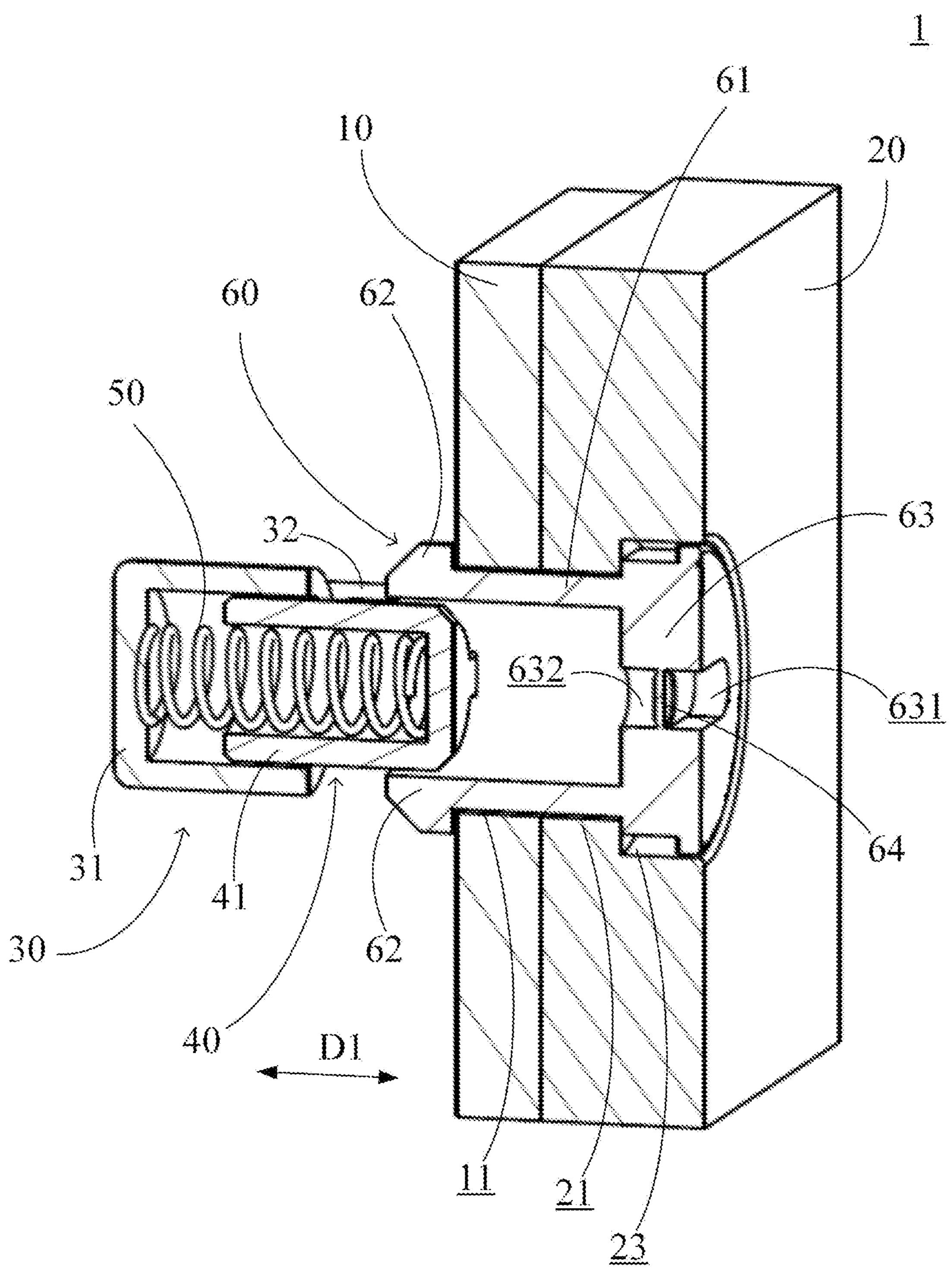
FIG. 2 is a cross-sectional view of the anti-disassembly device shown in FIG. 1.
Figure 3:
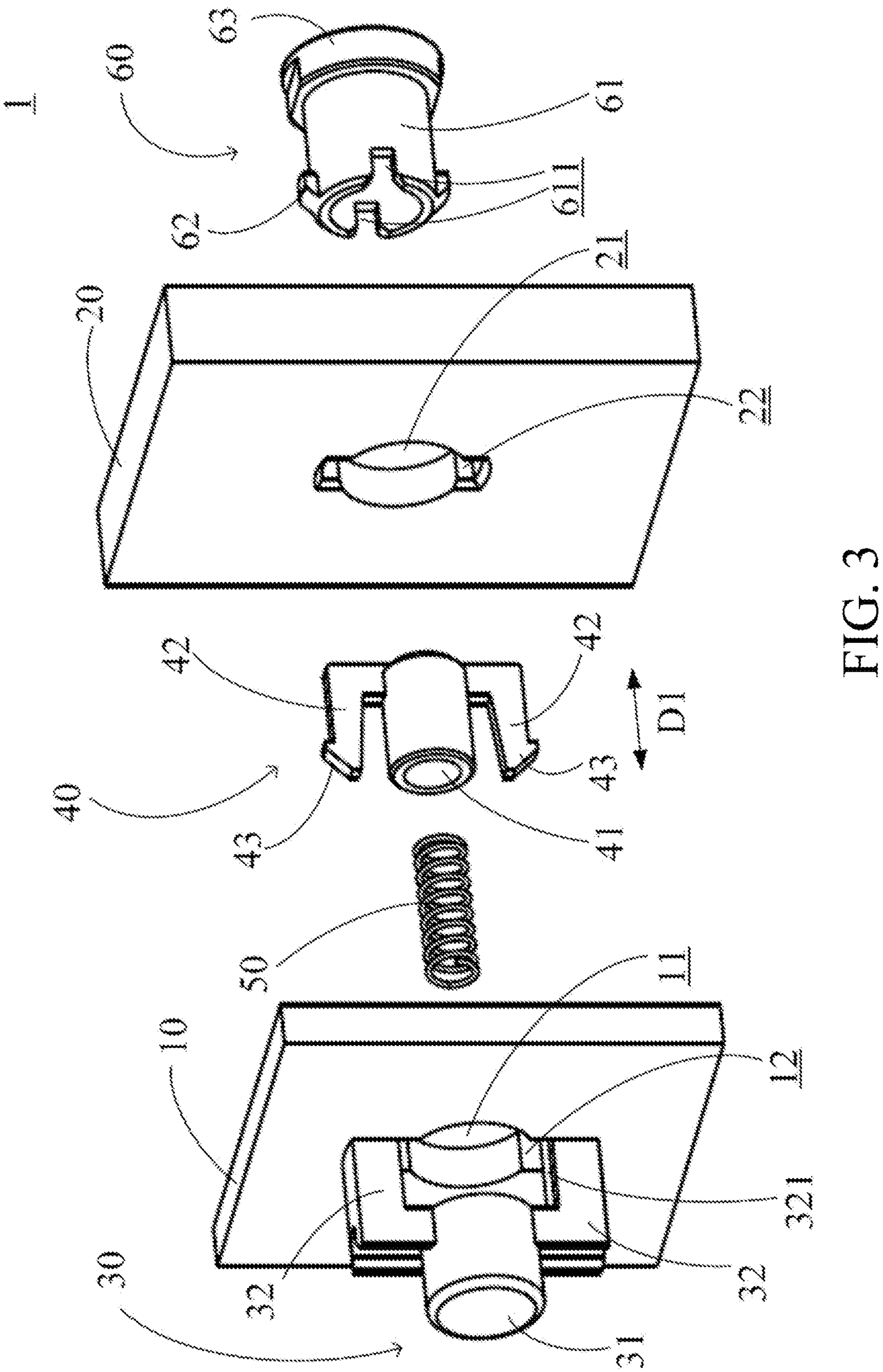
FIG. 3 and FIG. 4 are exploded views of the anti-disassembly device shown in FIG. 1.
Figure 4:
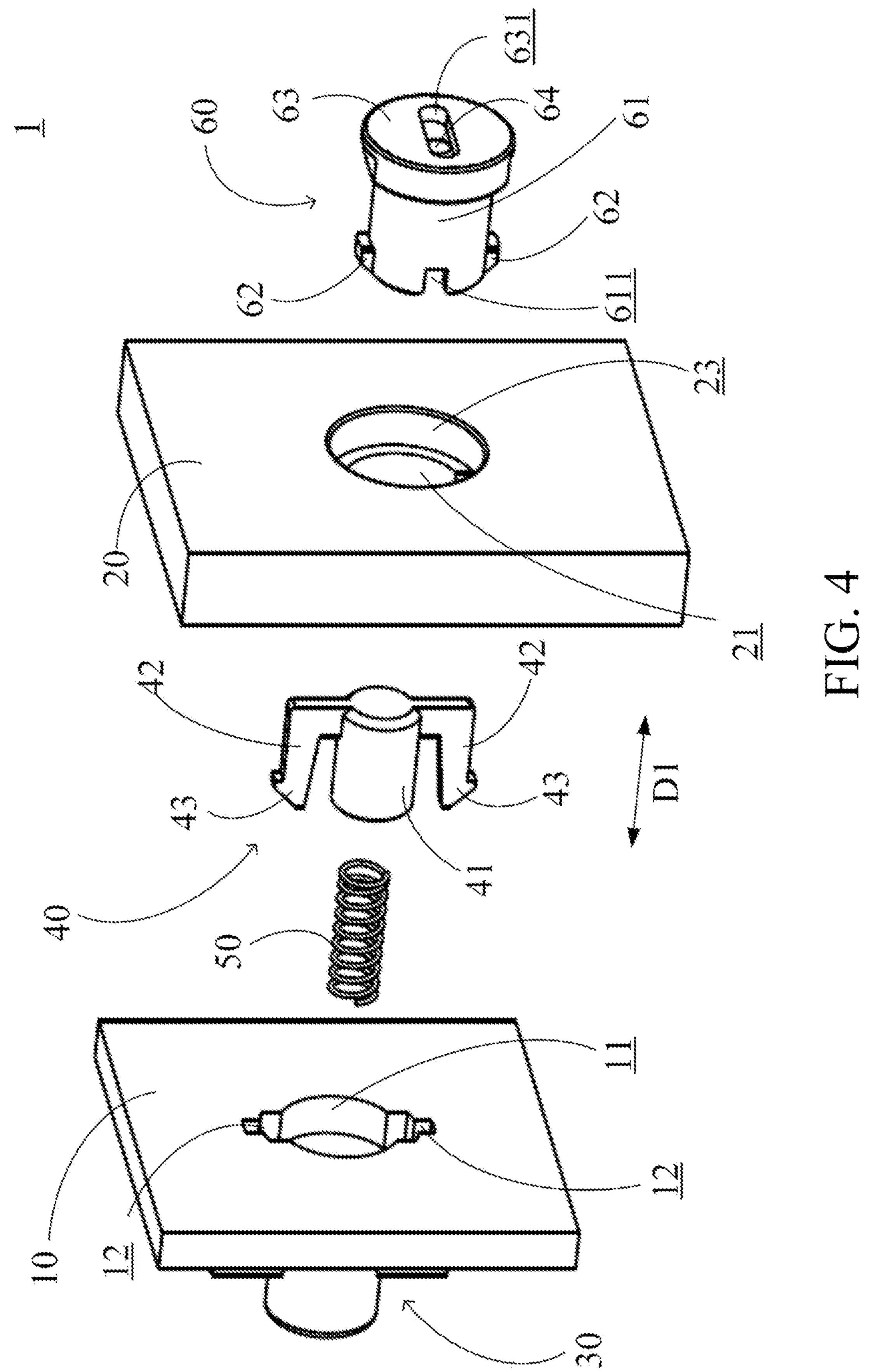
Figure 5:
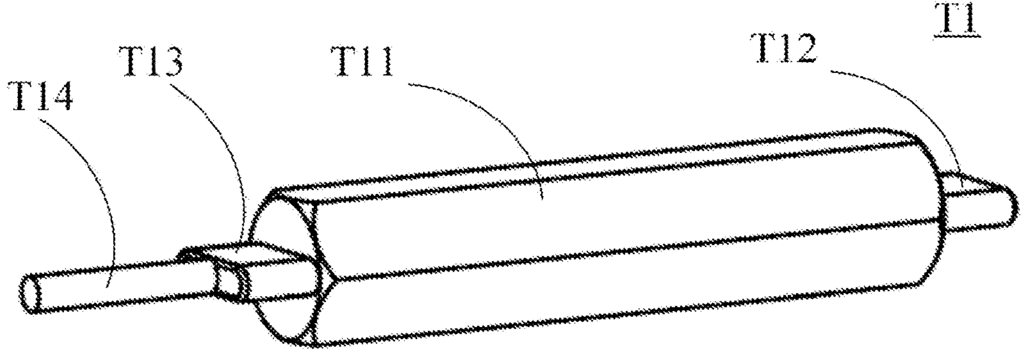
FIG. 5 is a perspective view of a tool for the anti-disassembly device in accordance with of the present disclosure.

FIG. 1 is a perspective view of a first embodiment of an anti-disassembly device 1 in accordance with the present disclosure. FIG. 2 is a cross-sectional view of the anti-disassembly device 1 of FIG. 1. In FIG. 1 and FIG. 2, the anti-disassembly device 1 in a locked state. FIG. 3 and FIG. 4 are exploded views of the anti-disassembly device 1 of FIG. 1. FIG. 5 is a perspective view of a tool T1 for the anti-disassembly device 1 in accordance with the present disclosure. The anti-disassembly device 1 includes a first part 10, a second part 20, a fixing element 30, a bolt 40, an elastic element 50, and a nail 60. The anti-disassembly device 1 is used to combine the first part 10 with the second part 20, and the anti-disassembly device 1 can be locked or unlocked using the tool T1 in FIG. 5. In this embodiment, the first part 10 and the second part 20 may be part of the housing and/or the cover of the electronic device, but are not limited to this.

The first part 10 extends perpendicular to a movement direction D1, but is not limited to this. For example, the first part 10 may have a curved surface. The first part 10 includes a first through hole 11 and first restriction grooves 12. The first through hole 11 and first restriction grooves 12 pass through first part 10 in the movement direction D1. The first restriction grooves 12 are separated from each other, and connected to the first through hole 11. Moreover, the area of the opening of the first through hole 11 is greater than the area of the opening of each first restriction groove 12. In the embodiment, there are two first restriction grooves 12, but not limited thereto. The first through hole 11 are among the first restriction grooves 12.

When the anti-disassembly device 1 in the locked state of FIG. 1 and FIG. 2, the second part 20 is in contact with the first part 10. The second part 20 extends perpendicular to the movement direction D1, but not limited thereto. For example, the second part 20 may have a curved surface. The second part 20 includes a second through hole 21 and second restriction grooves 22. The second through hole 21 and the second restriction grooves 22 pass through the second part 20 in the movement direction D1. The second restriction grooves 22 are separated from each other, and connected to the second through hole 21. Moreover, the area of the second through hole 21 is greater than the area of each second restriction groove 22. In the embodiment, there are two second restriction grooves 22, but not limited thereto. The second through hole 21 is among the second restriction grooves 22.

In FIG. 1 to FIG. 3, when the first part 10 is stacked on the second part 20 in the movement direction D1, the first through hole 11 corresponds to the second through hole 21, and the first restriction groove 12 corresponds to the second restriction groove 22. The area of the first through hole 11 is equal to or approximately equal to the area of the second through hole 21, and the area of the first restriction groove 12 is approximately equal to or greater than the area of the second restriction groove 22. The areas of the first through hole 11 and the first restriction groove 12 are measured on the same section that is perpendicular to the movement direction D1. The areas of the second through hole 21 and the second restriction groove 22 are measured on the same section that is perpendicular to movement direction D1.

The fixing element 30 is affixed to the first part 10. In the embodiment, the fixing element 30 and the first part 10 are integrally formed. The fixing element 30 and the first part 10 may be made of the same material, such as plastic. The fixing element 30 includes a fixing portion 31 and connection portions 32. The fixing portion 31 is a hollow structure. The fixing portion 31 extends in the movement direction D1, and corresponds to the first through hole 11. The fixing portion 31 is separated from the first part 10. The connection portions 32 are respectively connected to the fixing portion 31 and the first part 10. Each connection portion 32 includes a guide groove 321 extending in the movement direction D1.

The bolt 40 is movably disposed in the fixing element 30. The bolt 40 includes a central portion 41, arms 42, and hooks 43. The central portion 41 is a hollow structure. The central portion 41 extends in the movement direction D1, and corresponds to the first through hole 11. The arms 42 are connected to the central portion 41, and the hooks 43 are respectively connected to the ends of the arms 42. In the embodiment, the bolt 40 includes two arms 42, and the central portion 41 is between the arms 42.

When the anti-disassembly device 1 is in the locked state, the central portion 41 is in the fixing portion 31. The arm 42 is movably in contact with the connection portion 32. In the embodiment, the arm 42 of the bolt 40 is movably disposed in the guide groove 321, and the guide groove 321 restricts the bolt 40 from moving in the movement direction D1. Moreover, the hooks 43 are hooked on the top of the connection portion 32 of the fixing element 30, and the fixing portion 31 is between the multiple hooks 43, so the hooks 43 can be used to prevent the bolt 40 from detaching from the fixing element 30.

The elastic element 50 is disposed between the fixing element 30 and the bolt 40. In the embodiment, the elastic element 50 is a spring. When the anti-disassembly device 1 is in locked state, the elastic element 50 is in the fixing portion 31 and the central portion 41, and the ends of the elastic element 50 respectively abuts to the fixing portion 31 and the central portion 41. The elastic element 50 provides elastic force to the fixing portion 31 and the central portion 41 to maintain the bolt 40 in a locked position.

The nail 60 is movably disposed in the first through hole 11 and the second through hole 21. The nail 60 includes a body 61, buckles 62, and a base 63. The body 61 may be a hollow structure, extending in the movement direction D1. The body 61 has lock grooves 611. The lock grooves 611 are separated from the buckles 62. The buckles 62 and the base 63 are connected to the body 61, and the body 61 is between the buckles 62 and the base 63. The buckles 62 are connected to the side wall of the body 61, and the body 61 is among the buckles 62. The second part 20 further includes a constraint slot 23 connected to the second through hole 21. In the embodiment, the constraint slot 23 surrounds the second through hole 21.

In the embodiment, the width of the body 61 matches the width of the first through hole 11 and the width of the second through hole 21. The width of the buckle 62 matches the width of the first restriction groove 12 and the width of the second restriction groove 22. The width of the base 63 watches the width of the constraint slot 23. The width of the base 63 is greater than the body 61, and the width of the constraint slot 23 is greater than the width first through hole 11 and the width of the second through hole 21. The widths are measured in the same direction that is perpendicular to the movement direction D1.

In the embodiment, when the anti-disassembly device 1 in in a locked state, the nail 60 fastens to the first part 10 and the second part 20. The body 61 is in the first through hole 11 and the second through hole 21. The buckle 62 fastens the edge of the first through hole 11 of the first part 10. The base 63 is in the constraint slot 23, and abuts the bottom of the constraint slot 23. Moreover, the elastic force of the elastic element 50 maintains the arm 42 of the bolt 40 in the lock groove 611, thereby preventing the nail 60 from rotating relative to the first part 10, the second part 20, and the bolt 40. Therefore, the second part 20 can be well combined with the first part 10 through the anti-disassembly device 1 of this embodiment.

In one embodiment, the first part 10 is a part of the outer casing of an electronic device, and the second part 20 is a part of the cover of the electronic device. The fixing element 30, the bolt 40, and the elastic element 50 are within the outer casing of the electronic device, and the nail 60 is exposed on the outer surface of the cover of the electronic device. When the anti-disassembly device 1 is in the locked state, the fixing element 30 and the bolt 40 restrict the movement and the rotation of the nail 60 relative to the second part 20. Therefore, it is difficult for the user to remove the nail 60 from the second part 20 from the outside of the electronic device without damaging the second part 20 or the nail 60, thereby achieving the purpose of anti-tampering.

In the embodiment, the base 63 of the nail 60 includes a rotation groove 631 and an unlock hole 632. The rotation groove 631 extends perpendicular to the movement direction D1, and the unlock hole 632 extends in the movement direction D1. The cross-sectional area of the unlock hole 632 is smaller than the cross-sectional area of the rotation groove 631. The cross-section of the unlock hole 632 and the cross-section of the rotation groove 631 are perpendicular to the movement direction D1. The cross-section of the unlock hole 632 is parallel to the cross-section of the rotation groove 631. The nail 60 further includes an anti-demolition wall 64 between the rotation groove 631 and the unlock hole 632, to separate the rotation groove 631 and the unlock hole 632. In other word, the anti-demolition wall 64 covers the unlock hole 632. In the embodiment, the body 61, the buckle 62, the base 63, and the anti-demolition wall 64 of the nail 60 may be made of plastic material, and may be integrally formed.

As shown in FIG. 5, the tool T1 includes a handle T11, a first rotation element T12, a second rotation element T13, and a rod T14. The first rotation element T12 and the second rotation element T13 are respectively located at two ends of the handle T11. The size of first rotation element T12 and the second rotation element T13 matches the size of the rotation groove 631 of the nail 60. The rod T14 is connected to the second rotation element T13.

Figure 6:
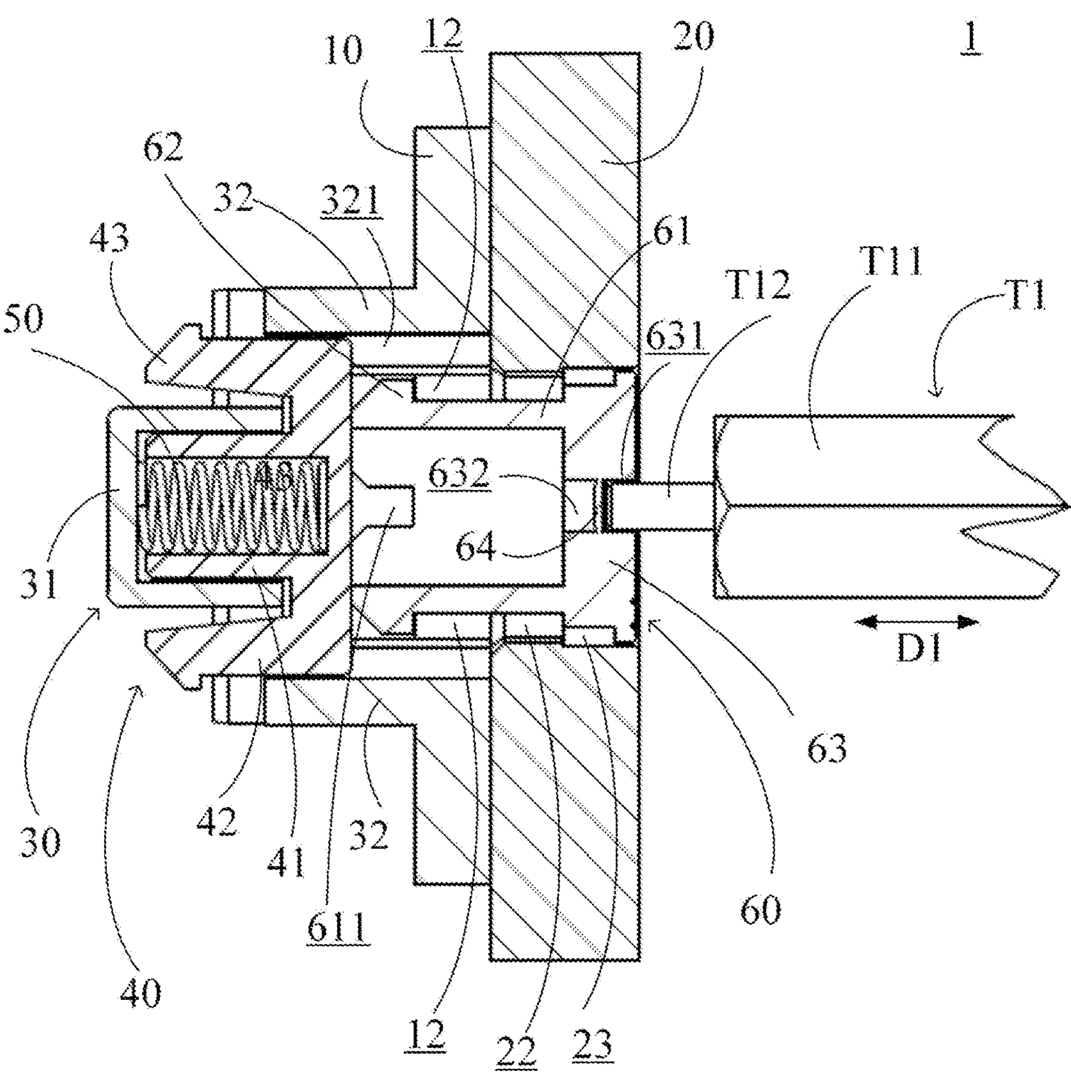
FIG. 6 and FIG. 7 are cross-sectional views of the anti-disassembly device in a fastening process in accordance with of the present disclosure.
Figure 7:
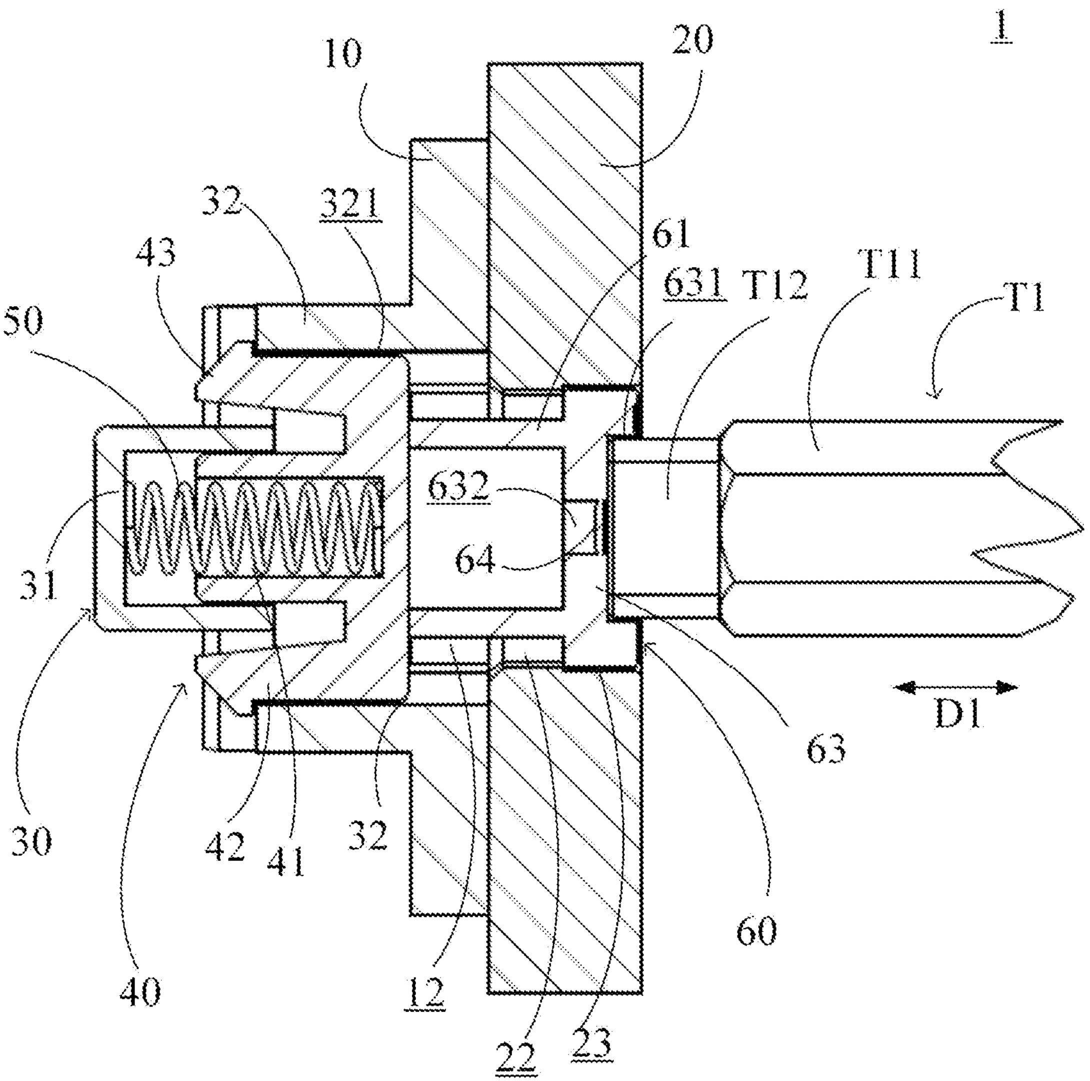

FIG. 6 and FIG. 7 are cross-sectional views of the anti-disassembly device 1 in a fastening process in accordance with the present disclosure. As shown in FIG. 6, when the second part 20 is affixed to the first part 10, the second part 20 is in contact with first part 10, first. Next, the first rotation element T12 of the tool T1 is inserted into the rotation groove 631, and push the nail 60 to move in the movement direction D1. At this time, the nail 60 passes through the second part 20 and the first part 10 sequentially in the movement direction D1, and the body 61 of the nail 60 pushes the central portion 41 of the bolt 40 to move in the movement direction D1. Moreover, after the buckle 62 passes through the restriction groove 22 of the second part 20 and the first restriction groove 12 of the first part 10, the buckle 62 is moved to an installation position. In the installation position of FIG. 6, the buckle 62 is adjacent to the opening of the first restriction groove 12, the body 61 abuts the arm 42 of the bolt 40. Moreover, the base 63 is in the constraint slot 23, and the central portion 41 of the bolt 40 is in the fixing portion 31 of the fixing element 30.

After the user rotates the tool T1 to rotate the nail 60, as shown in FIG. 1 and FIG. 7, the anti-disassembly device 1 is in a locked state. In the embodiment, the first rotation element T12 of the tool T1 is inserted into the rotation groove 631, and the nail 60 is rotated about 90 degrees by the tool T1. The buckle 62 fastens the first part 10, and the base 63 is in the constraint slot 23. Moreover, the bolt 40 is pushed in the movement direction D1 by the elastic force of the elastic element 50, so that the arm 42 of the bolt 40 is located in the lock groove 611 of the nail 60 in FIG. 6. In the locked state, the fixing element 30 and the bolt 40 restrict nail 60 the movement and the rotation of the nail 60 relative to the second part 20. Therefore, the second part 20 can be combined to the first part 10 by the anti-disassembly device 1.

Figure 8:
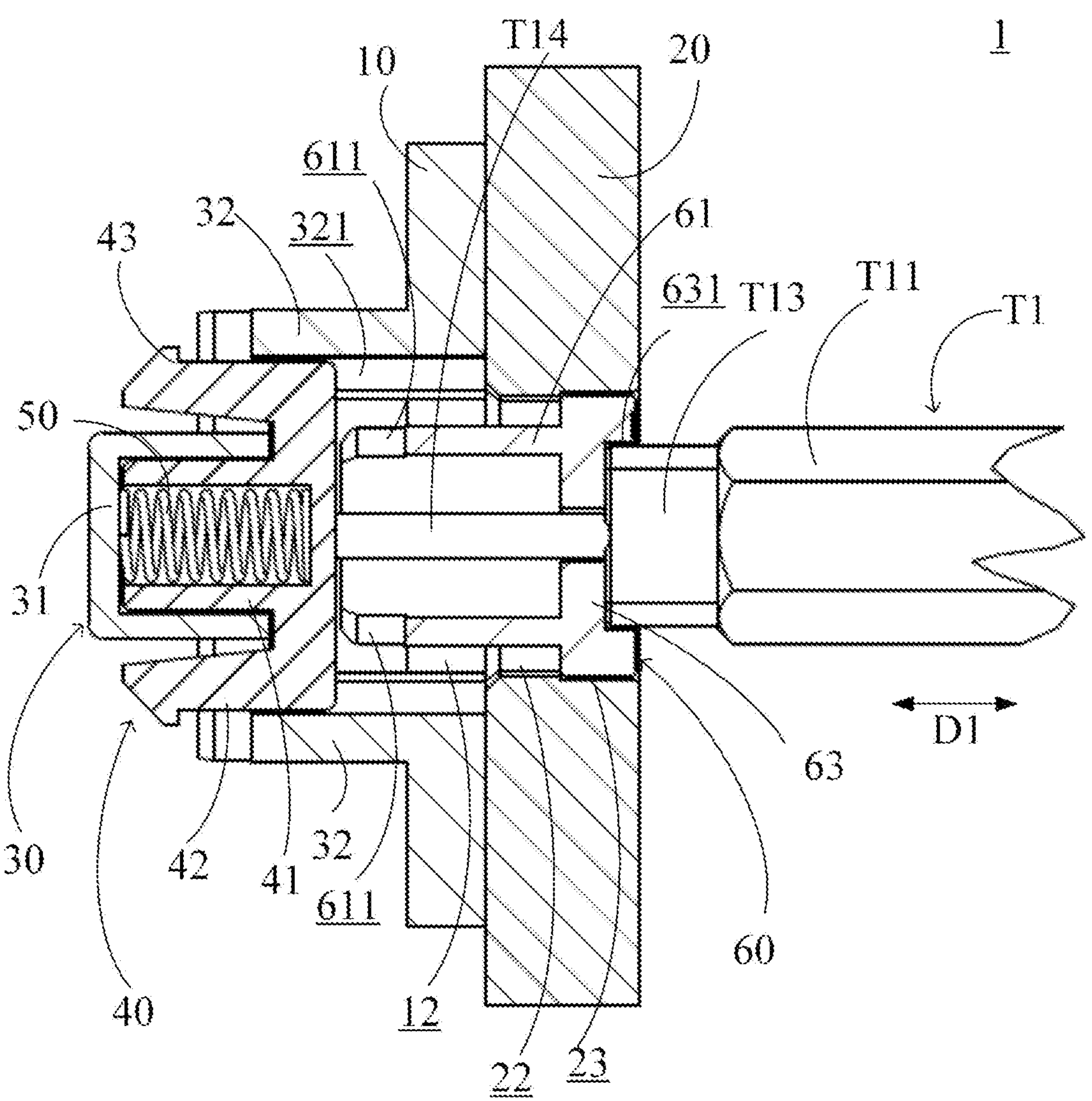
FIG. 8 and FIG. 9 are cross-sectional views of the anti-disassembly device during a disassembly process in accordance with of the present disclosure.
Figure 9:
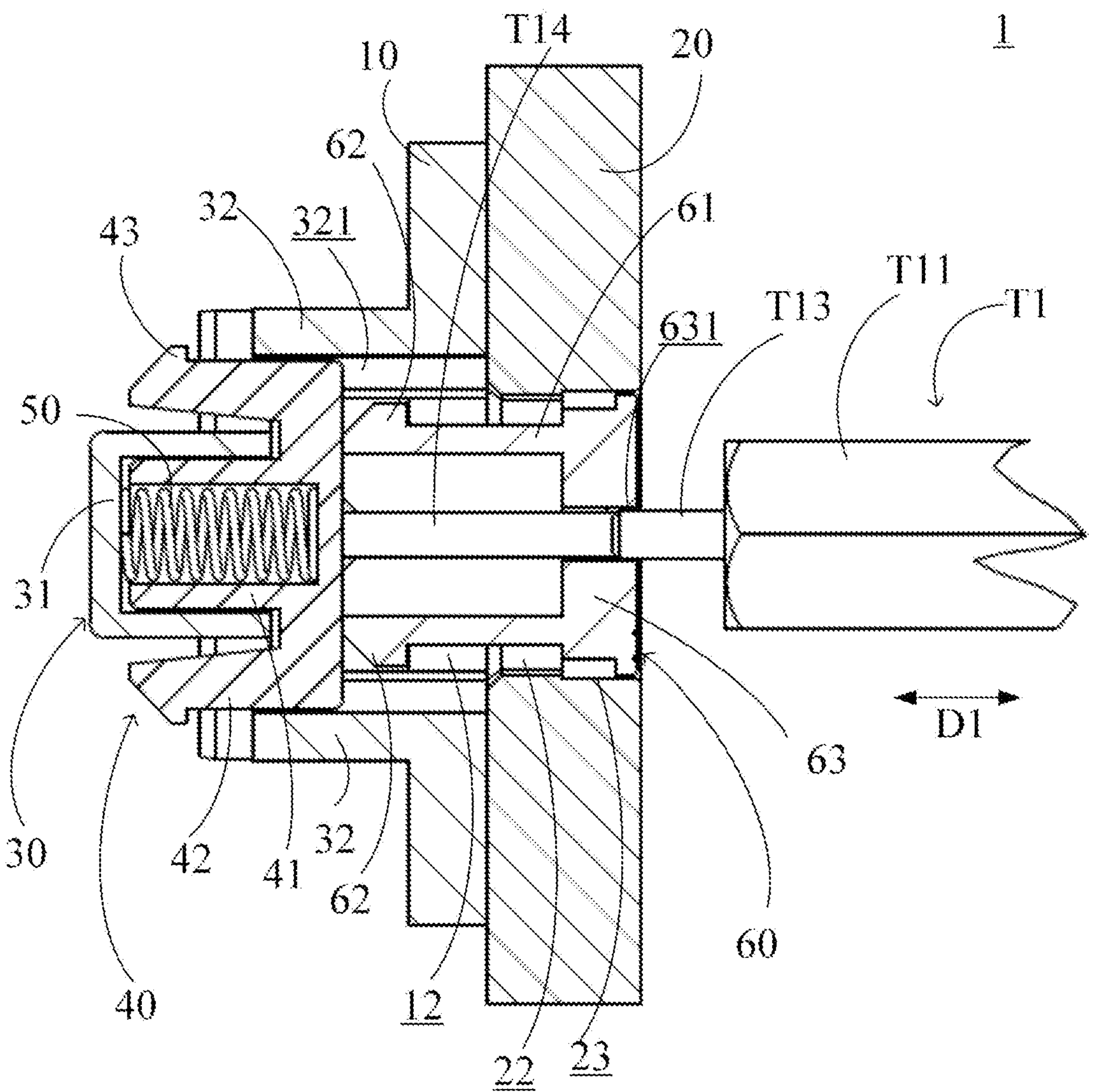

FIG. 8 and FIG. 9 are cross-sectional views of the anti-disassembly device 1 during a disassembly process in accordance with the present disclosure. As shown in FIG. 7 and FIG. 8, when the user wants to separate the second part 20 from the first part 10, the rod T14 of the tool T1 pierces the anti-demolition wall 64 via the rotation groove 631, and then passes through the unlock hole 632. Afterward, the rod T14 continues to move in the movement direction D1 to push the central portion 41 of the bolt 40 away from the lock groove 611 of the nail 60. At this time, the nail 60 is rotatable relative to the first part 10. In addition, the second rotation element T13 of the tool T1 is in the rotation groove 631.

When the nail 60 is rotated to an unlocking position by the tool T1, the buckle 62 corresponds to the first restriction groove 12 and the second restriction groove 22, and the first part 10 is separatable from the second part 20. In the embodiment, the second rotation element T13 of the tool T1 is inserted into the rotation groove 631, and the nail 60 can be rotated about 90 degrees by the tool T1. As shown in FIG. 9, the anti-disassembly device 1 in an unlocking state. The nail 60 can be removed from the first part 10 and the second part 20 in the movement direction D1, and the buckle 62 can pass through the first restriction groove 12 and the second restriction groove 22 in sequence. Since the nail 60 is separated from the first through hole 11 and/or the second through hole 21, the second part 20 can be separated from the first part 10.

Figure 10:
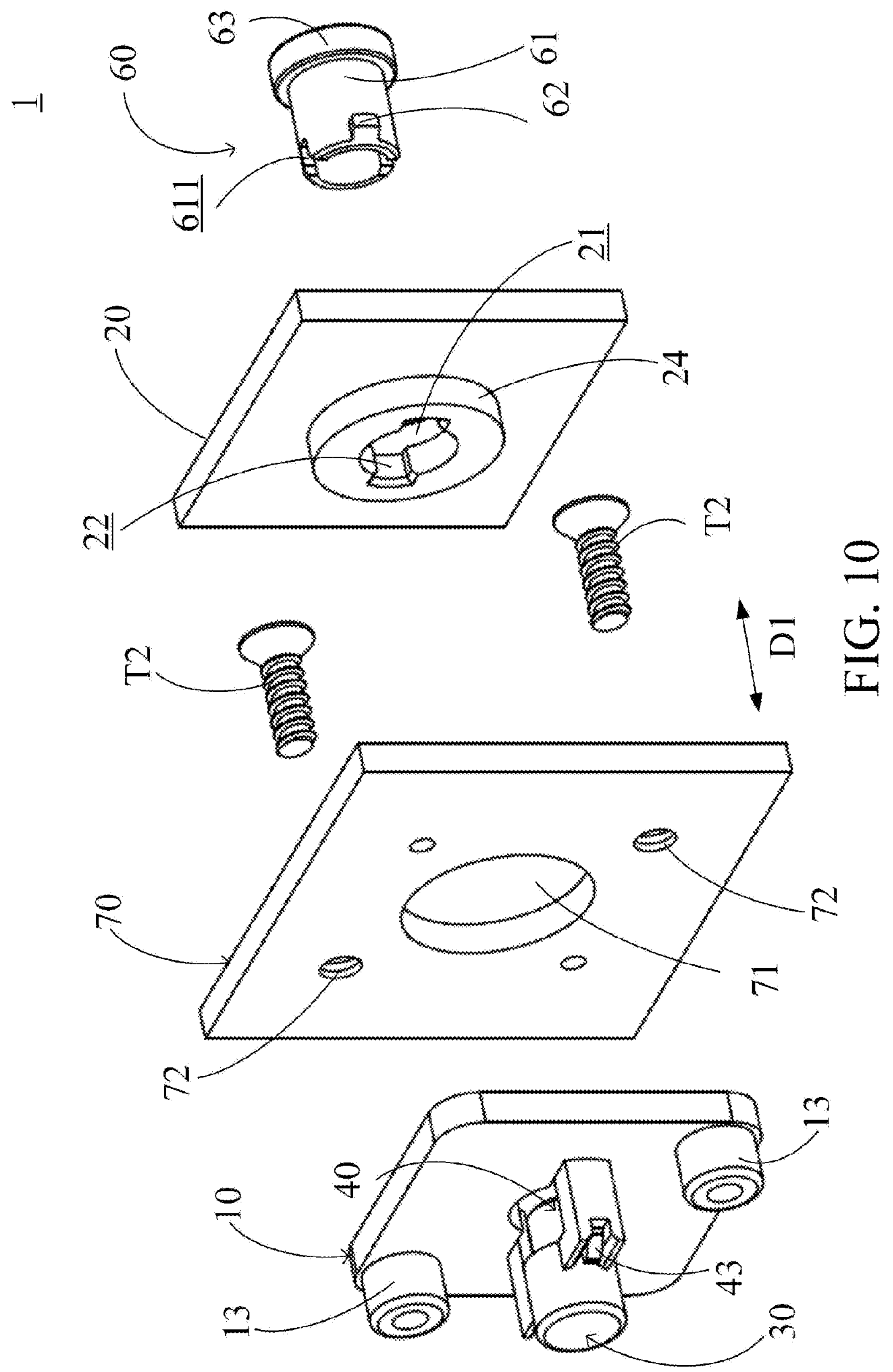
FIG. 10 is an exploded view of a second embodiment of an anti-disassembly device in accordance with the present disclosure.

FIG. 10 is an exploded view of a second embodiment of an anti-disassembly device 1 in accordance with the present disclosure. The anti-disassembly device 1 further includes a third part 70. The third part 70 extends perpendicular to the movement direction D1, but it is not limited thereto. For example, the third part 70 may have a curved surface. The third part 70 includes a first opening 71 and one or more second openings 72. The second part 20 and the third part 70 may be part of the casing and/or cover of the electronic device, but not limited thereto.

The first part 10 further includes lumps 13. Some fastening elements T2 pass through the second openings 72 of the third party 70 to fasten the lumps 13 of the first part 10, thereby combining the third part 70 to the first part 10. Moreover, the second part 20 further includes a protrusion 24. The second through hole 21 and the second restriction grooves 22 extend into the protrusion 24. When the second part 20 is attached to the third part 70, the protrusion 24 is in the first opening 71 of the third part 70.

The anti-disassembly device of the present disclosure is disassembled by a specific tool, which can prevent the user from easily disassembling the outer casing of the electronic device. In addition, when the user uses the tool to unlock the anti-disassembly device, the anti-demolition wall of the nail needs to be broken. It is difficult for users to restore the nail, and the nail has specific specifications that is difficult to purchase and replace. Therefore, manufacturers can determine whether the electronic device has been disassembled by users by observing whether the anti-demolition wall is damaged. The manufacturers can determine whether the user is responsible for the damage to the electronic device.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An anti-disassembly device comprising:

a first part comprising a first through hole, and a first restriction groove connected to the first through hole;

a fixing element affixed to the first part;

a bolt movably disposed in the fixing element;

an elastic element between the fixing element and the bolt;

a second part in contact with the first part, and comprising a second through hole; and a nail movably disposed in the first through hole and the second through hole, and the nail comprising a lock groove, a body in the first through hole, and a buckle connected to the body;

wherein when the anti-disassembly device is in a locked state, the nail is fastened to the first part and the second part, the buckle is fastened to the first part, and the bolt is in the lock groove to prevent the nail from rotating relative to the first part, when the bolt is moved out of the lock groove, the nail is rotatable relative to the first part, when the nail is rotated to an unlocking position, the first part is separatable from the second part, and the buckle corresponds to the first restriction groove, and the buckle extends through the first restriction groove when the nail is away from the first part in a movement direction.

2. The anti-disassembly device as claimed in claim 1, wherein the fixing element comprises a guide groove, the bolt is movably disposed in the guide groove, and the guide groove restricts the bolt from moving in the movement direction.

3. The anti-disassembly device as claimed in claim 1, wherein the bolt comprises a central portion and an arm connected to the central portion, wherein when the anti-disassembly device is in the locked state, the arm is in the lock groove.

4. The anti-disassembly device as claimed in claim 3, wherein the fixing element comprises a fixing portion and a connection portion connected to the fixing portion, the elastic element abuts the fixing portion and the central portion, and the arm is movably in contact with the connection portion.

5. The anti-disassembly device as claimed in claim 4, wherein each of the central portion and the fixing portion is a hollow structure, and the elastic element is disposed in the central portion and the fixing portion, and when the anti-disassembly device is in the locked state, the central portion is in the fixing portion.

6. The anti-disassembly device as claimed in claim 4, wherein the bolt further comprises a hook connected to the arm, the hook preventing the bolt away from the fixing element.

7. The anti-disassembly device as claimed in claim 1, wherein the second part further comprises a second restriction groove connected to the second through hole, and the body is in the second through hole when the anti-disassembly device is in the locked state, and the buckle extends through the second restriction groove when the nail is away from the second part in the movement direction.

8. The anti-disassembly device as claimed in claim 7, wherein an area of an opening of the first through hole is greater than an area of an opening of the first restriction groove, and an area of the second through hole is greater than an area of the second restriction groove.

9. The anti-disassembly device as claimed in claim 7, wherein a width of the buckle matches to a width of the first restriction groove and a width of the second restriction groove, and the width of the buckle, the width of the first restriction groove, and the width of the second restriction groove are measured in the same direction.

10. The anti-disassembly device as claimed in claim 7, wherein the nail further comprises a base connected to the body, and the second part further comprises a constraint slot connected to the second through hole, a width of the base is greater than a width of the body, and the base is in the constraint slot when the anti-disassembly device in the locked state, and the width of the base and the width of the body are measured in the same direction.

11. The anti-disassembly device as claimed in claim 10, wherein the constraint slot surrounds the second through hole, and a width of the constraint slot is greater than a width of the first through hole and a width of the second through hole, and the width of the constraint, the width of the first through hole, and the width of the second through hole are measured in the same direction.

12. The anti-disassembly device as claimed in claim 10, wherein the width of the body matches respectively to a width of the first through hole and a width of the second through hole, the width of the base matches to a width of the constraint slot, and the width of the body, the width of the first through hole, and the width of the second through hole, the width of the base, and the width of the constraint slot are measured in the same direction.

13. The anti-disassembly device as claimed in claim 1, wherein the nail further comprises a unlock hole and an anti-demolition wall covering the unlock hole, and the bolt is accessible to be pushed away from the lock groove by a tool when the tool pierces the anti-demolition wall to access the unlock hole.

14. The anti-disassembly device as claimed in claim 13, wherein the nail further comprises a rotation groove, the anti-demolition wall is between the rotation groove and the rotation groove, a cross-sectional area of the unlock hole is smaller than a cross-sectional area of the rotation groove, and the nail is rotatable by inserting a tool into the rotation groove, wherein the cross-sectional area of the unlock hole is parallel to the cross-sectional area of the rotation groove.

* * * * *